(12) United States Patent
Jeong et al.

(10) Patent No.: US 9,488,814 B2
(45) Date of Patent: Nov. 8, 2016

(54) OPTICAL LENS

(71) Applicants: Hae Woon Jeong, Seoul (KR); ASIABRIDGE JAPAN CO., LTD., Kanagawa (JP); J-TEK CO., LTD., Suwon-si, Gyeonggi-do (KR)

(72) Inventors: Hae Woon Jeong, Seoul (KR); Hidenori Nonaka, Kanagawa (JP)

(73) Assignees: Hae Woon Jeong, Seoul (KR); ASIABRIDGE JAPAN CO., LTD., Kawasaki, Kanagawa (JP); J-TEK CO., LTD., Suwon-si, Gyeonggi-do (KR)

(*) Notice: Subject to any disclaimer, the term of this patent is extended or adjusted under 35 U.S.C. 154(b) by 441 days.

(21) Appl. No.: 14/076,078

(22) Filed: Nov. 8, 2013

(65) Prior Publication Data

US 2014/0328069 A1 Nov. 6, 2014

(30) Foreign Application Priority Data

May 1, 2013 (KR) .......................... 10-2013-0049063

(51) Int. Cl.
*F21V 3/00* (2015.01)
*G02B 19/00* (2006.01)
*H01L 33/58* (2010.01)
*F21V 5/04* (2006.01)
*F21V 5/02* (2006.01)

(52) U.S. Cl.
CPC ....... *G02B 19/0061* (2013.01); *G02B 19/0014* (2013.01); *H01L 33/58* (2013.01); *F21V 5/02* (2013.01); *F21V 5/04* (2013.01)

(58) Field of Classification Search
CPC .......... G02B 19/0014; G02B 19/0061; G02B 19/0009; G02B 19/0047; G02B 19/0028; G02B 19/0066; G02B 19/0071; F21V 5/005; F21V 5/043; F21V 5/046; F21V 5/02; F21V 5/04; F21V 5/048; F21V 5/045; F21V 5/002; H01L 33/58
USPC ........... 362/336, 337, 338, 339, 340, 311.02, 362/309, 335, 308; 359/743, 742
See application file for complete search history.

(56) References Cited

U.S. PATENT DOCUMENTS 8,068,288 B1 * 11/2011 Pitou .................... G02B 3/08
                                                    359/743
8,749,891 B2 * 6/2014 Lin ................... G02B 27/0911
                                                    359/641

(Continued)

FOREIGN PATENT DOCUMENTS

| JP | 59-226381 | 6/1983 |
|---|---|---|
| JP | 63-6702 | 1/1988 |
| JP | 2002-49326 | 2/2002 |
| KR | 10-2006-0051465 | 5/2006 |
| KR | 10-2009-0015854 | 2/2009 |

*Primary Examiner* — Renee Chavez
*Assistant Examiner* — James Endo
(74) *Attorney, Agent, or Firm* — Novick, Kim & Lee, PLLC; Jae Youn Kim

(57) ABSTRACT

An optical lens having an incident surface on which the light emitted from a light emitting diode is incident and having a concave portion into which the light is received and an emitting surface emitting the light incident on the incident surface therethrough, the optical lens including: a plurality of refraction prevention portions protruded unitarily from the emitting surface to allow the light around a light axis emitted through the emitting surface to travel straight, without having any refraction, each refraction prevention portion having an orthogonal surface formed thereon to the advancing direction of the light incident through the incident surface.

5 Claims, 10 Drawing Sheets

(56) References Cited

U.S. PATENT DOCUMENTS

| | | | |
|---|---|---|---|
| 2007/0230190 A1* | 10/2007 | Sasaki | F21S 48/1154 362/336 |
| 2008/0247173 A1* | 10/2008 | Danek | F21V 5/04 362/309 |
| 2008/0310159 A1* | 12/2008 | Chinniah | F21S 48/1154 362/244 |
| 2010/0271708 A1* | 10/2010 | Wilcox | G02B 17/0856 359/654 |
| 2011/0096553 A1* | 4/2011 | Shimokawa | F21V 5/04 362/311.02 |
| 2011/0305026 A1* | 12/2011 | Mochizuki | F21V 7/0091 362/308 |
| 2012/0134152 A1* | 5/2012 | Ye | F21V 5/04 362/235 |

* cited by examiner

OPTICAL LENS

BACKGROUND OF THE INVENTION

1. Field of the Invention

The present invention relates to an optical lens, and more particularly, to an optical lens that is capable of minimizing the reduction of the light intensity around a light axis in a process of diffusing the light emitted from a light emitting diode, so that the luminance distribution of an irradiated member can be uniformly obtained and the brightness of the light can be improved.

2. Background of the Related Art

Generally, a surface light source device is used as an irradiation device for a liquid crystal display monitor used in a personal computer or television, and the surface light source device makes use of a plurality of light emitting diodes (hereinafter, referred to as "LED") as the point sources of light.

The surface light source device includes a plate-like luminous flux control member (optical lens) having the almost same shape as that of a liquid crystal display and the plurality of LEDs arranged to the shape of a matrix on the back surface of the luminous flux control member.

The light emitted from the LEDs is incident on the interior of the luminous flux control member from the back surface of the luminous flux control member and then emitted from an emitting surface opposite to the back surface of the luminous flux control member.

Next, the liquid crystal panel is back-lighted through the emitted light.

Examples of the conventional surface light source devices will be discussed hereinafter.

A first conventional art is disclosed in Japanese Patent Application Laid-open No. 2002-49326. According to the first conventional art, as shown in FIG. 1a, a surface light source device 10 has microlens arrays 12 disposed correspondingly to a plurality of LEDs 11, so that the light emitted from the LEDs 11 is emitted in the direction perpendicular to the plane, that is, upwardly, through the microlens arrays 12.

A second conventional art is disclosed in Japanese Patent Application Laid-open No. 59-226381. According to the second conventional art, as shown in FIG. 1b, a light emitting display device 13 includes an LED 11, a concave lens 14 and a convex lens 15.

The light emitted from the LED 11 is diffused by means of the concave lens 14, collected by the convex lens 15, and then emitted in the almost parallel direction to the light axis of the LED 11.

Herein, the light axis means the advancing direction of light from the center of the luminous flux of the light stereoscopically emitted from the LED 11 as the point source of light.

A third conventional art is disclosed in Japanese Patent Application Laid-open No. 63-6702. According to the third conventional art, as shown in FIG. 1c, a display device 16 includes an LED 11 as the source of light.

The light emitted from the LED 11 is collected and induced forwardly by a light collecting lens 17 and then diffused by a diffusion lens 18.

A fourth conventional art is shown in FIG. 2. As shown, a display device 20 includes a plurality of LED chips 21, a light diffusion member 22, and an irradiated member 23 (for example, a liquid crystal display panel) on which the light transmitted through the light diffusion member 22 is irradiated.

The LED chips 21 are equally spaced apart from each other, and each LED chip 21 is formed by attaching a luminous flux control member 25 having a semi-spherical emitting surface 24 to an LED 26.

The light emitted from each LED chip 21 is transmitted through the light diffusion member 22 and supplied to the irradiated member 23.

However, the above-mentioned conventional arts have the following problems.

Firstly, in case of the surface light source device 10 according to the first conventional art, the microlens arrays 12 are not continuously maintained in shape in the intermediate portion between the neighboring LEDS 11.

Accordingly, the light intensity of the light emitted from the intermediate portion is drastically changed, thereby causing the deviation of the brightness of the light emitted to seriously occur on the boundary portion between the neighboring microlens arrays 12.

Secondly, in case of the second conventional art, when a plurality of concave lenses 14 is continuously connected to each other in the light emitting display device 13, the concave lenses 14 do not form any plane.

Further, when a plurality of convex lenses 15 is continuously connected to each other in the light emitting display device 13, the convex lenses 15 do not form any plane.

Accordingly, for example, it is hard to supply uniform surface irradiation to the member having a large area like a large-sized liquid crystal display panel.

Thirdly, in case of the display device 16 according to the third conventional art, the light emitted from the LED 11 is collected by the light collecting lens 17 and then diffused by the diffusion lens 18.

Accordingly, the difference of the brightness of the light does not appear better than that in the first conventional art.

However, it is difficult to mix the light emitted from the neighboring LEDs 11 with each other, which causes the deviation of the light colors emitted from the LEDs 11 to seriously occur.

Thirdly, in case of the display device 20 according to the fourth conventional art, the luminance deviation of the light emitted from each LED 26 becomes increased in the shape of a waveform as shown in FIG. 3.

Accordingly, the light emitted from each LED 26 becomes dark in a space between the neighboring LEDs 26, which fails to provide uniform surface irradiation.

According to the fourth conventional art, as shown by a curve A in FIG. 3, the light intensity of the light emitted from each LED chip 21 is locally increased around the light axis L of the LED 26.

As a result, it is difficult to mix the light emitted from the neighboring LEDs 26 with each other, which causes the deviation of the light colors emitted from the plurality of LEDs 26 to seriously occur.

So as to solve the above-mentioned problems, accordingly, Korean Patent Registration Nos. 10-0971639 and 10-0977336 disclose a new luminous flux control member (optical lens) which diffuses the light emitted from the point sources of light, mixes the light emitted from the neighboring LEDs with each other, and decreases the deviation of the light colors emitted from the LEDs.

As appreciated therefrom, if the LED is used for wide angle irradiation, the optical element (luminous flux control member) converting the light emitted from the LED into the light diffused to a wide angle is generally disposed in front of the LED.

That is, the light emitted from the LED is emitted through the optical element in accordance with the refraction index of the material of the optical element and Snell's law, and thus the light is converted into the light diffused to a wide angle.

The luminous flux control member converts the light emitted from the LEDs as the point sources of light into the light having the diffusion of about 120° with respect to the vertical lines (light axis) on the center of the LEDs.

That is, a portion where the light intensity of the light emitted from the LED is strong, that is, the light in the range of an angle a in FIG. 4 is diffused to the range of an angle c in FIG. 4.

However, the conventional luminous flux control member (optical lens) has the following problems.

The light emitted from the LEDs as the point sources of light is diffused to a wide angle, but after the light in the range of the angle a is diffused to the wide angle having the range of the angle c, the light intensity may be decreased as shown in FIG. 5.

Accordingly, the intensity of the light is not optimized, which undesirably makes the efficiency deteriorated, and if the optical lens is used for back-lighting, a diffusion plate like a prism sheet should be additionally needed to improve the intensity of the light, which increases manufacturing cost and thus provides economical disadvantages.

SUMMARY OF THE INVENTION

Accordingly, the present invention has been made in view of the above-mentioned problems occurring in the prior art, and it is an object of the present invention to provide an optical lens that is provided with refraction prevention portions formed on the center portion of an emitting surface to allow the incident light to be straightly emitted, without having any refraction, thereby minimizing the reduction of the light intensity around a light axis, uniformly distributing the luminance to an irradiated member, and improving the brightness of the light.

To accomplish the above object, according to a first aspect of the present invention, there is provided an optical lens having an incident surface on which the light emitted from a light emitting diode is incident and having a concave portion into which the light is received and an emitting surface emitting the light incident on the incident surface therethrough, the optical lens including: a plurality of refraction prevention portions protruded unitarily from the emitting surface to allow the light around a light axis emitted through the emitting surface to travel straight, without having any refraction, each refraction prevention portion having an orthogonal surface formed thereon to the advancing direction of the light incident through the incident surface, so that the light emitted through the orthogonal surface of each refraction prevention portion travels straight in the direction of the incidence through the incident surface, without having any refraction.

According to the present invention, desirably, the maximum formation range of the refraction prevention portions on the emitting surface is set in the range of about 20% with respect to the emitting surface area between an angle a corresponding to the half of the light emitted from the light emitting diode toward the incident surface and an incident angle where the light is refracted on the interior of the optical lens.

According to the present invention, desirably, each refraction prevention portion is formed in the shape of a circumference in the concentric direction from the center of the emitting surface.

To accomplish the above object, according to a second aspect of the present invention, there is provided an optical lens having an incident surface on which the light emitted from a light emitting diode is incident and having a concave portion into which the light is received and an emitting surface emitting the light incident on the incident surface therethrough, the optical lens including: a plurality of refraction prevention portions protruded unitarily from the emitting surface to allow the light around a light axis emitted through the emitting surface to travel straight, without having any refraction, each refraction prevention portion having a shape of a cone having any one generating line orthogonal to the advancing direction of light incident through the incident surface.

According to the present invention, desirably, each refraction prevention portion has a shape of a dot protruded from the emitting surface around the light axis, and the longitudinal section of each dot has a shape of a triangle having an orthogonal surface to the advancing direction of the light incident through the incident surface.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, an explanation on an optical lens according to the preferred embodiments of the present invention will be in detail given with reference to the attached drawing.

An optical lens is called an optical device or a luminous flux control member and serves to diffuse the light irradiated from a light emitting diode to a wide angle.

The optical lens is contained in a light emitting device together with the light emitting diode and used as a back light unit of a display device like a liquid crystal display panel.

According to the present invention, the optical lens diffuses the light irradiated from the light emitting diode to a wide angle, while light intensity is being not decreased as it reaches a light axis on which the light intensity may be reduced in the diffusion process, thereby allowing the luminance on an irradiated member to be uniformly distributed.

At this time, the light axis means the advancing direction of the light in the center of the stereoscopic luminous flux of the light emitted from the light emitting diode.

Accordingly, the brightness of the light emitted from the light emitting diode can be improved through the optical lens.

The optical lens is desirably formed to have a shape of rotational symmetry around the light axis, but it is not necessary for the optical lens to have the shape of rotational symmetry with respect to the light emitting diode. That is, the light emitting diode may take the shape of a rectangular parallelepiped.

At this time, the optical lens is desirably made of thermoplastic resin having good light transmission.

For example, the optical lens is desirably made of transparent resin like polymethylmethacrylate (PMMA), polycarbonate (PC), and epoxy resin, or transparent glass.

At this time, the refraction index of the optical lens is generally in the range between 1.45 and 1.65.

Figure 1A:
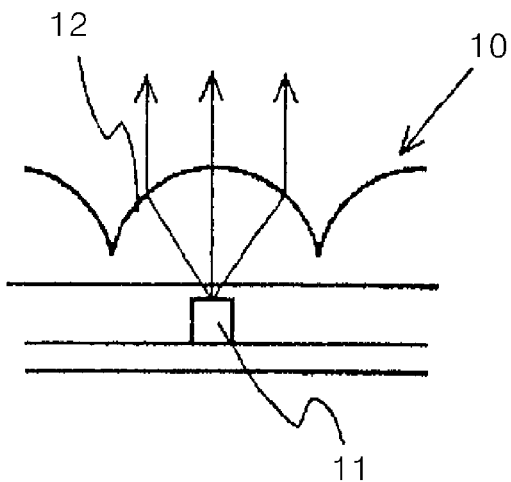
FIG. 1a is a schematic view showing a surface light source device according to a first conventional art.
Figure 1B:
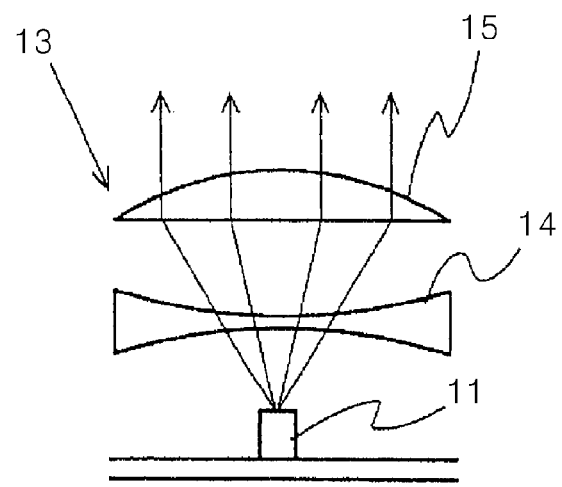
FIG. 1b is a schematic view showing a surface light source device according to a second conventional art.
Figure 1C:
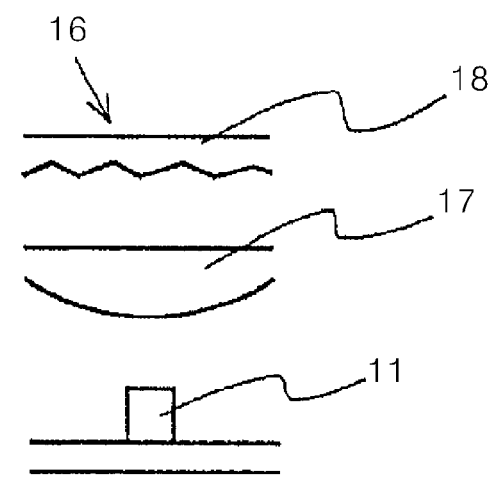
FIG. 1c is a schematic view showing a surface light source device according to a third conventional art.
Figure 2:
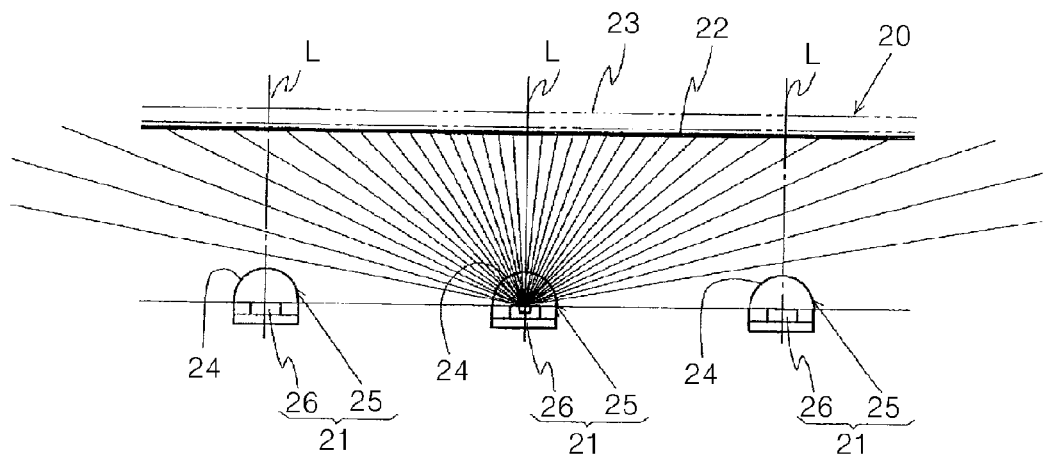
FIG. 2 is a schematic view showing a surface light source device according to a fourth conventional art.
Figure 3:
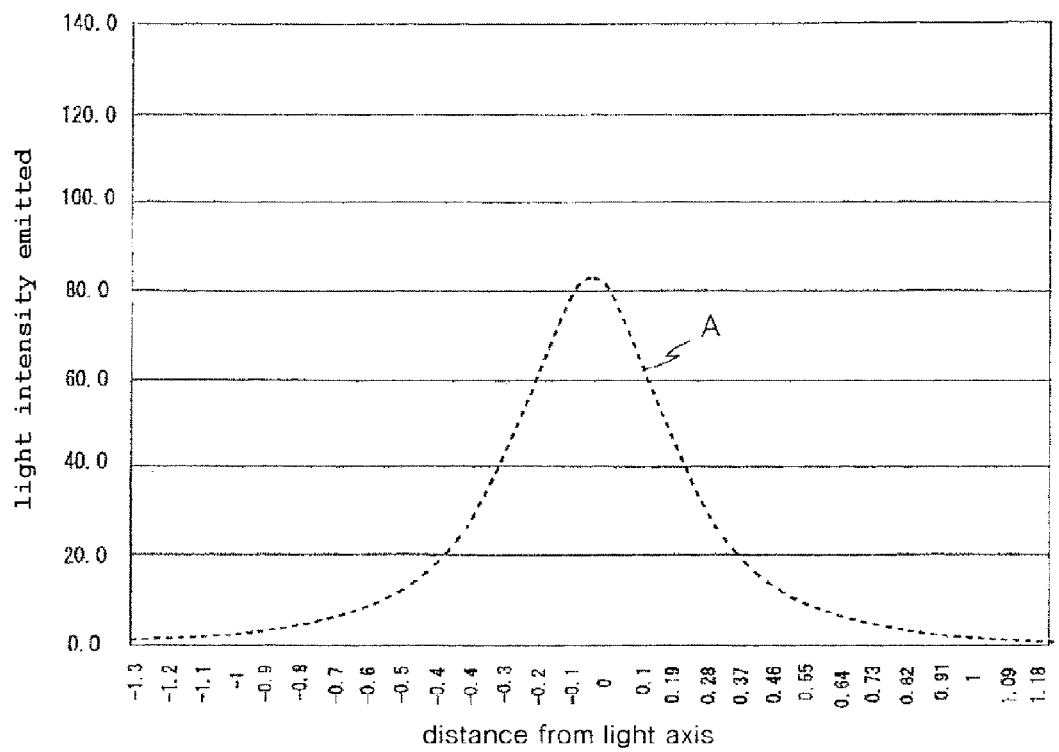
FIG. 3 is a graph showing the distribution of the light intensity of the light irradiated to an irradiated member from the surface light source device in the conventional art.
Figure 4:
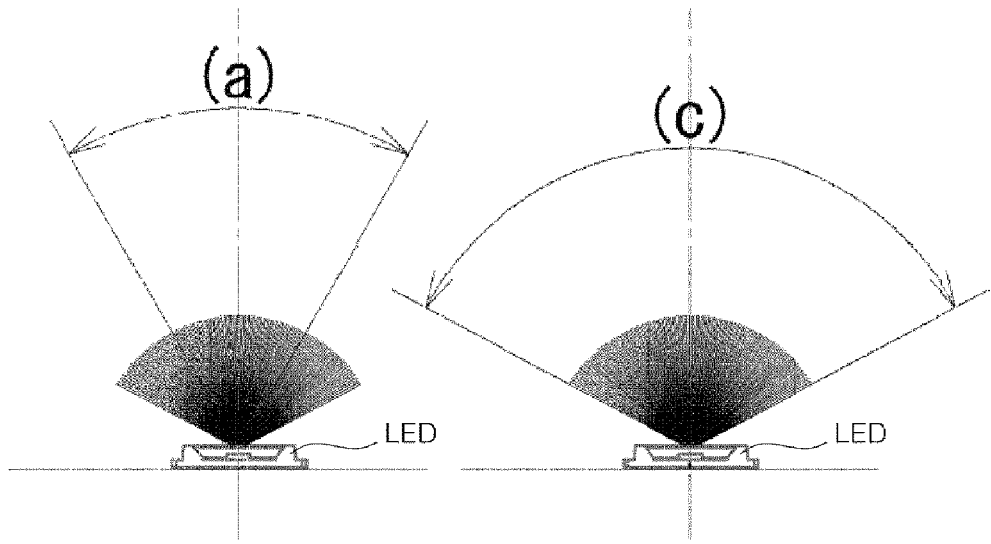
FIG. 4 is a schematic view showing the emission direction of the light from a light emitting diode wherein the light is diffused to a wide angle, so as to solve the problems occurring in the conventional art.
Figure 5:
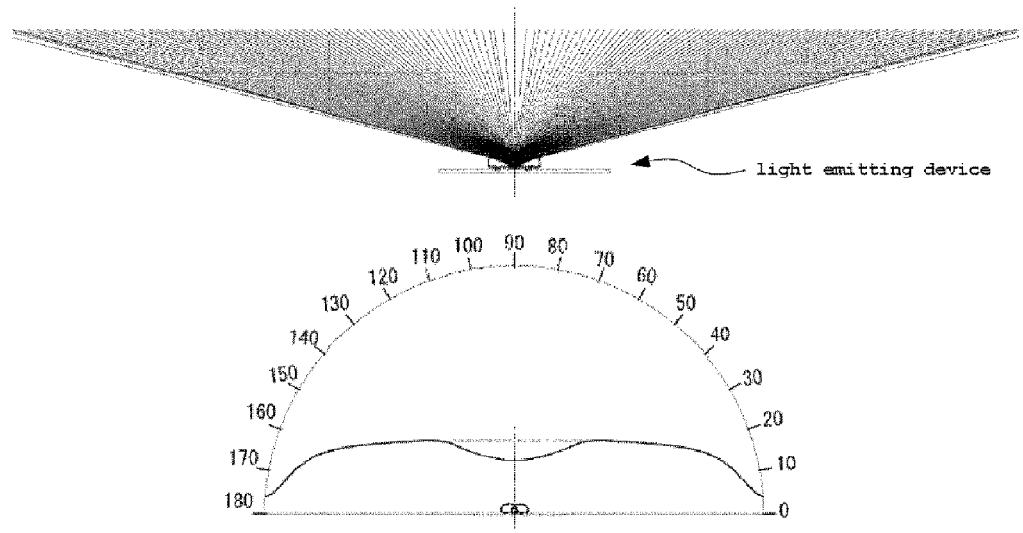
FIG. 5 is a schematic view showing the non-uniform luminance distribution wherein light intensity is decreased as it reaches a light axis in the process the light emitted from a light emitting diode is converted and diffused to a wide angle through an optical lens in conventional practices.
Figure 6:
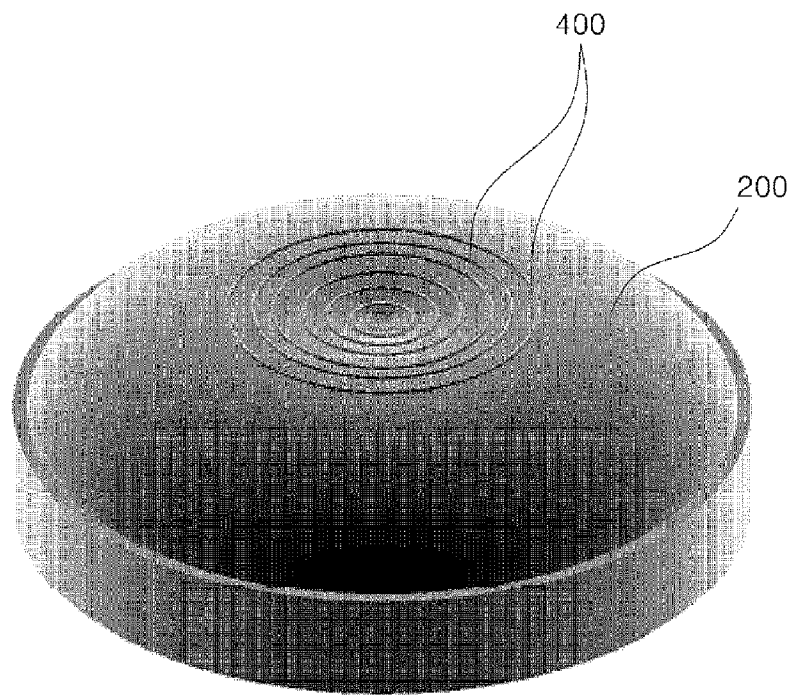
FIG. 6 is a perspective view showing an optical lens according to a first embodiment of the present invention.
Figure 7:
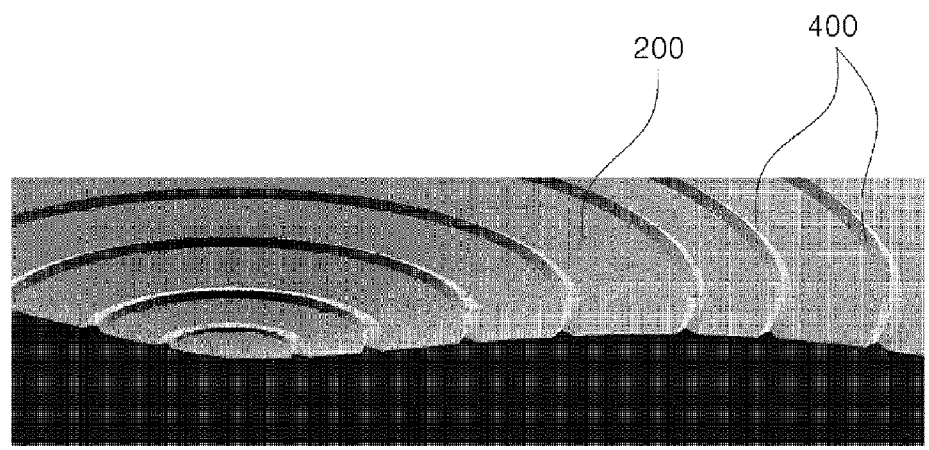
FIG. 7 is an enlarged sectional view showing the main parts of the optical lens according to the first embodiment of the present invention.
Figure 8:
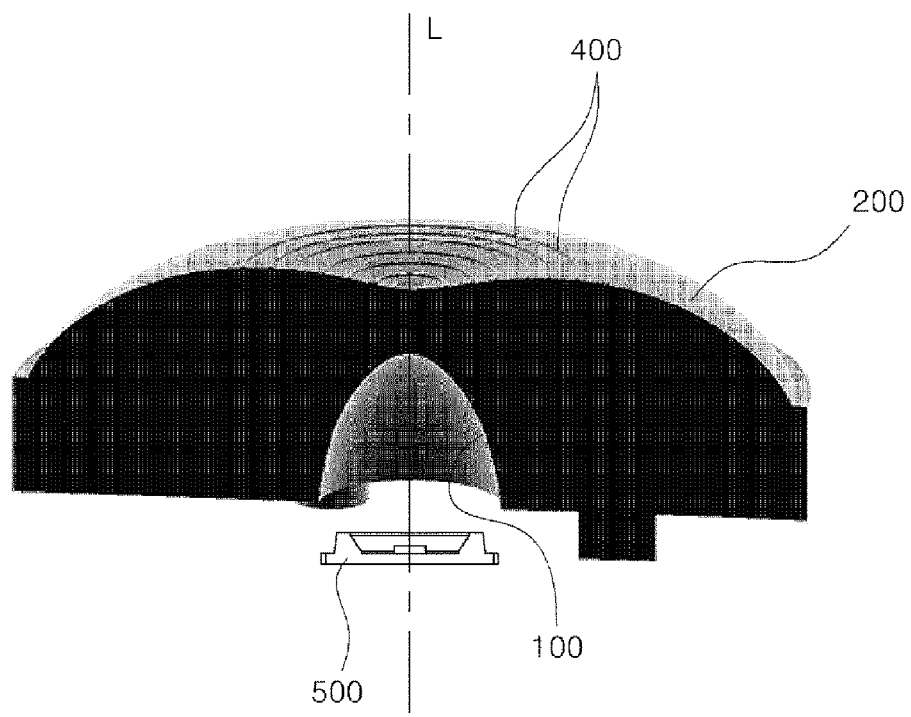
FIG. 8 is a sectional view showing the optical lens according to the first embodiment of the present invention.

As shown in FIGS. 6 to 8, the optical lens includes an incident surface 100 formed as the inside surface thereof, an emitting surface 200 formed as the outside surface thereof, a bottom surface 300 connecting the incident surface 100 and the emitting surface 200 with each other, and refraction prevention portions 400 formed on the emitting surface 200.

The incident surface 100 is a portion on which the light emitted from a light emitting diode 500 is first incident when it is transmitted to the optical lens, and the incident surface 100 is formed inside the optical lens.

At this time, as shown in FIG. 8, the sectional shape of the incident surface 100 is formed to cross a light axis L at a right angle and greatly changed in the inclination of the edge thereof around the light axis L, while being not greatly changed in the inclination of the edge thereof on the portion separated from the light axis L, thereby forming a concave portion.

At this time, the sectional shape of the incident surface 100 takes a bell-like shape.

Next, the emitting surface 200 is a portion where the light incident on the interior of the optical lens through the incident surface 100 is emitted to the outside through the transmission to the optical lens, which forms the surface of the optical lens.

At this time, the sectional shape of the emitting surface 200 is a little changed vertically in the inclination of the edge thereof around the light axis L, while becoming greatly changed in the inclination of the edge thereof on the portion separated from the light axis L and finally changed in a parallel relation direction to the light axis L.

Further, the shape of the emitting surface 200 around the light axis L is concaved, but it is not limited thereto.

That is, the direction of light is changed by both of the incident surface 100 and the emitting surface 200 of the optical lens, and therefore, the shape of the optical lens around the light axis L may be taken convexedly, without having any limitation.

Next, the refraction prevention portions 400 serve to allow the light transmitted to the emitting surface 200 through the incident surface 100 to travel straight, without any refraction.

This minimizes the reduction of the light intensity around the light axis L with respect to an irradiated member.

Figure 9:
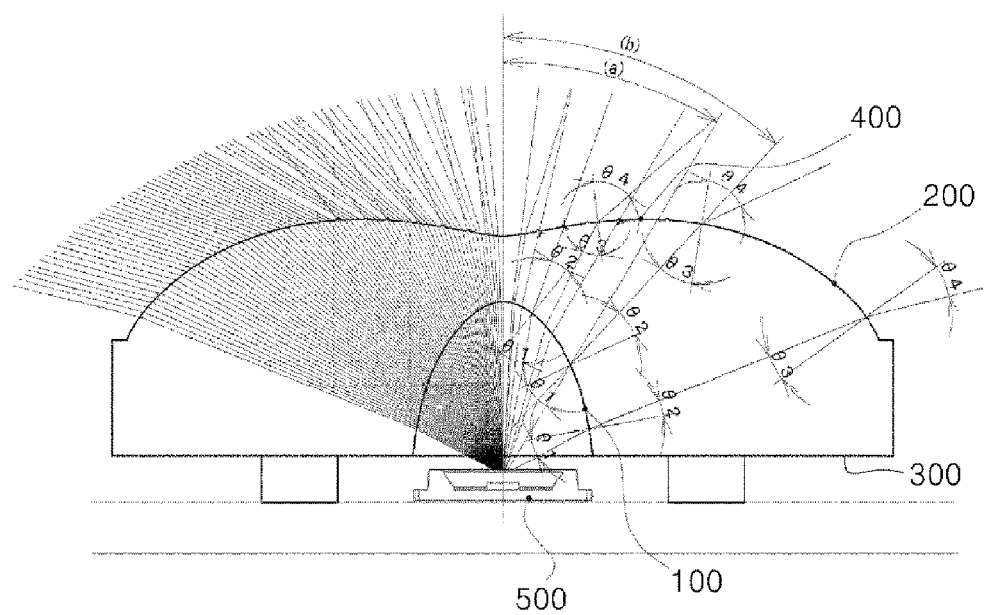
FIG. 9 is a schematic view showing the state wherein the light of a light emitting diode transmitting the optical lens according to the first embodiment of the present invention travels straight, without any refraction.

As shown in FIG. 9, according to the characteristics of the optical lens, an optical angle $\theta 2$ formed through the incidence of the light emitted from the light emitting diode 500 on the interior of the optical lens through the incident surface 100 is formed larger than an optical angle $\theta 1$ formed in the range from the light emitting diode 500 to the incident surface 100, and an optical angle $\theta 4$ emitted through the emitting surface 200 is formed larger than an optical angle $\theta 3$ formed between the light incident on the interior of the optical lens and the emitting surface 200, which is caused by the refraction of light.

The technical characteristics are disclosed in Korean Registration Nos. 10-0977336 and 10-0971639, and their detailed description will be avoided.

Figure 14:
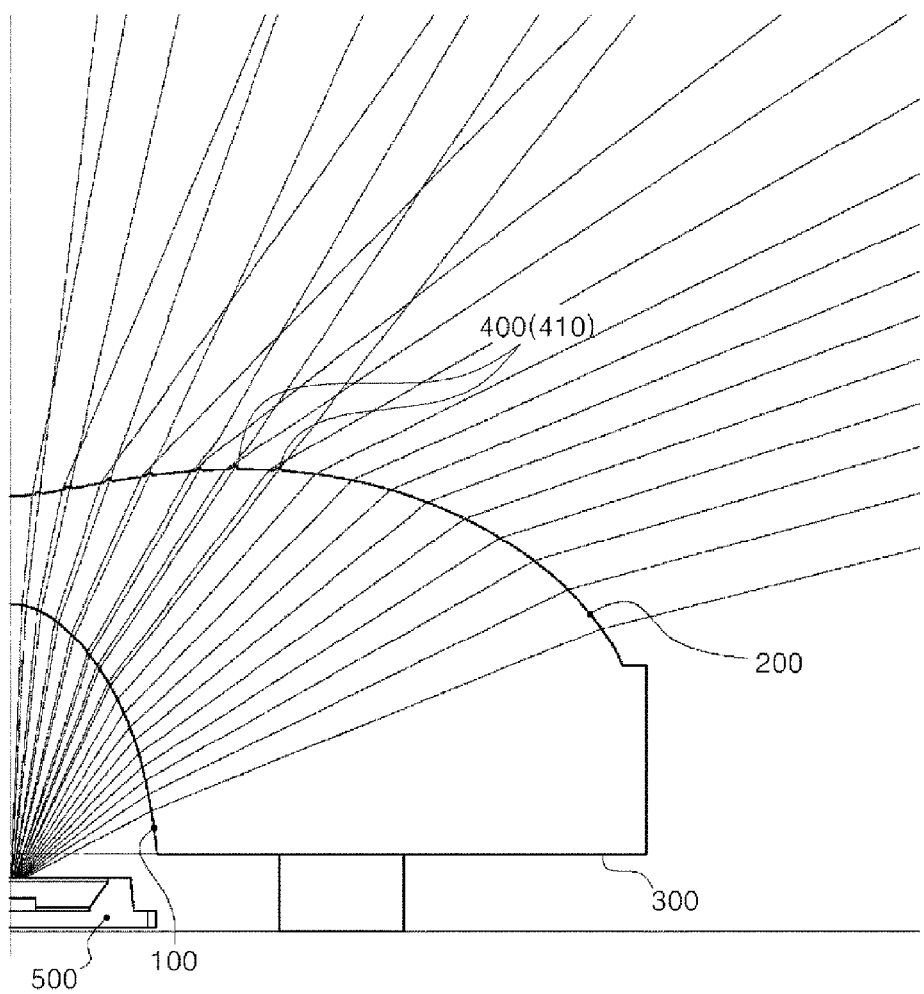
FIG. 14 is an enlarged view showing the state wherein the light of a light emitting diode transmitting the optical lens according to the third embodiment of the present invention travels straight, without any refraction.

On the other hand, as mentioned above, as the light transmitted to the optical lens is diffused, the light intensity is decreased around the light axis L, and accordingly, the light transmitted to the emitting surface 200 around the light axis L travels straight at an internal incidence angle of the optical lens, without any refraction, thereby minimizing the reduction of the light intensity around the light axis L as shown in FIGS. 9 and 14.

The refraction prevention portions 400 having the above-mentioned technical characteristics are formed on the emitting surface 200 around the light axis L, and they are protruded unitarily from the emitting surface 200.

At this time, the refraction prevention portions 400 are formed in a concentric direction from the center of the emitting surface 200.

At this time, as shown in FIG. 9, the maximum formation range of the refraction prevention portions 400 on the emitting surface 200 is desirably set in the range of about 20% with respect to the emitting surface area between an angle a corresponding to the half of the light emitted from the light emitting diode 500 to the incident surface 100 and an incident angle b where the light is refracted on the interior of the optical lens.

The maximum formation range of the refraction prevention portions 400 becomes the range wherein the light intensity is reduced to a maximum degree upon the diffusion of the light from the light emitting diode 500, and accordingly, the refraction prevention portions 400 are formed on the range to allow the light transmitted to the emitting surface 200 to travel straight therethrough, without having any refraction.

Accordingly, the reduction of the light intensity can be minimized with respect to the irradiated member, which improves the brightness of light.

On the other hand, as shown in FIGS. 6 to 8, each refraction prevention portion 400 has the shape of a circumference.

A detailed explanation on the refraction prevention portions 400 will be given with reference to the first embodiment of the present invention.

According to the first embodiment of the present invention, the refraction prevention portions 400 are formed in the shape of circumferences in the concentric direction from the center of the emitting surface 200.

That is, the refraction prevention portions 400 take a shape of tree rings.

At this time, as mentioned above, the maximum formation range of the refraction prevention portions 400 is desirably set in the range of about 20% with respect to the emitting surface area between the angle a corresponding to the half of the light emitted from the light emitting diode 500 to the incident surface 100 and the incident angle b where the light is refracted on the interior of the optical lens.

Figure 15:
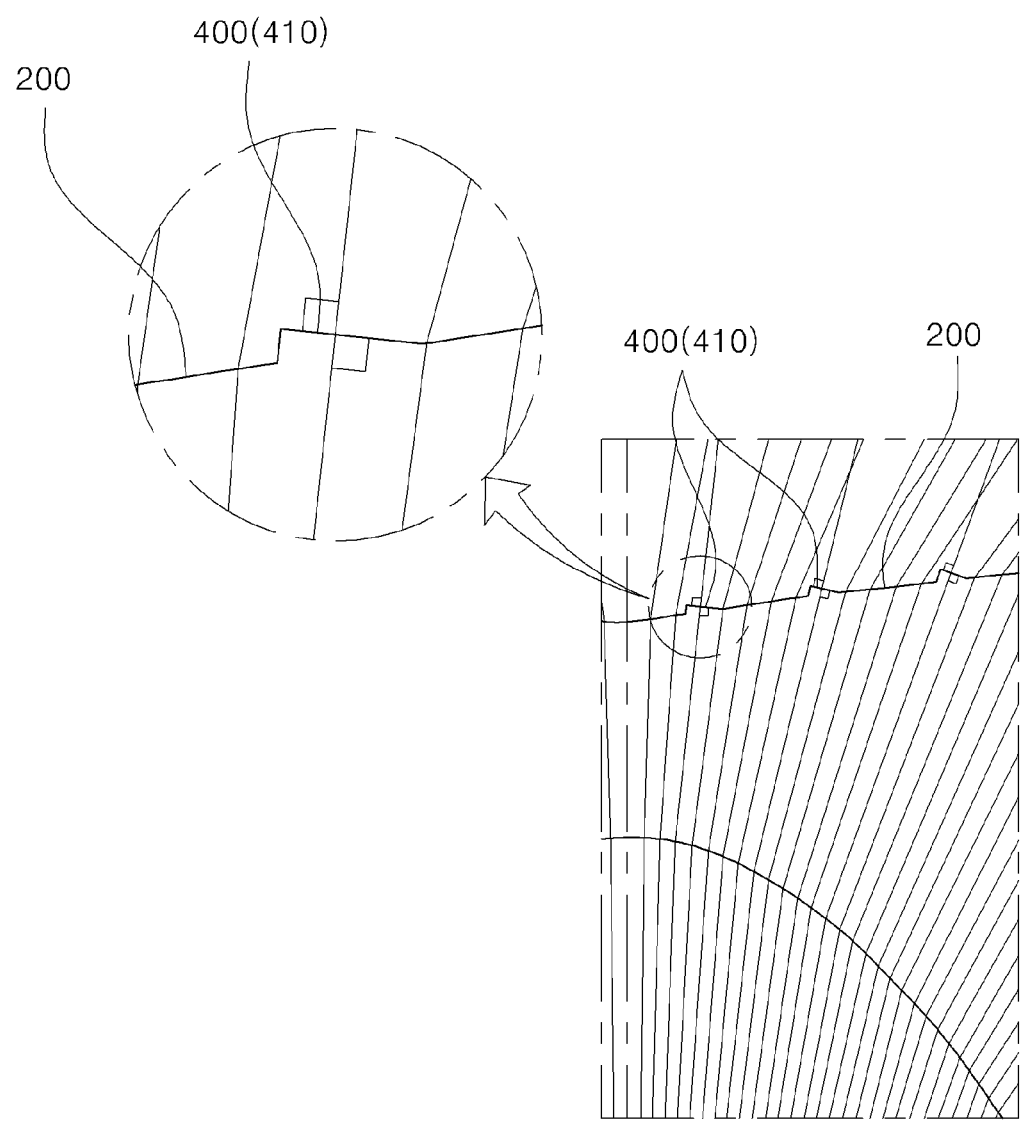
FIG. 15 is an enlarged view showing the main parts of FIG. 14, wherein the light of a light emitting diode transmitting the optical lens according to the third embodiment of the present invention is emitted straightly, without any refraction on the orthogonal surfaces of refraction prevention portions.

Further, as shown in FIG. 15, the surface of each refraction prevention portion 400 has an orthogonal surface 410 to the advancing direction of light, that is, the ray of light, incident through the incident surface 100.

That is, in the process where the light incident through the incident surface 100 is emitted through the emitting surface 200, the light is refracted when passed through the rounded emitting surface 200, but since the light is passed through the orthogonal surface 410 formed on one side of the surface of each refraction prevention portion 400, it travels straight, without having any refraction.

This is based upon the scientific principle that when the light traveling straight is passed through the orthogonal surface to the advancing direction of the light, it can travel straight, without having any refraction.

At this time, each refraction prevention portion 400 desirably has a sectional shape of a triangle, but it is not limited thereto.

That is, the sectional shape of the refraction prevention portion 400 does not matter only if the refraction prevention portion 400 has the orthogonal surface to the light passed through the incident surface 100.

Figure 10:
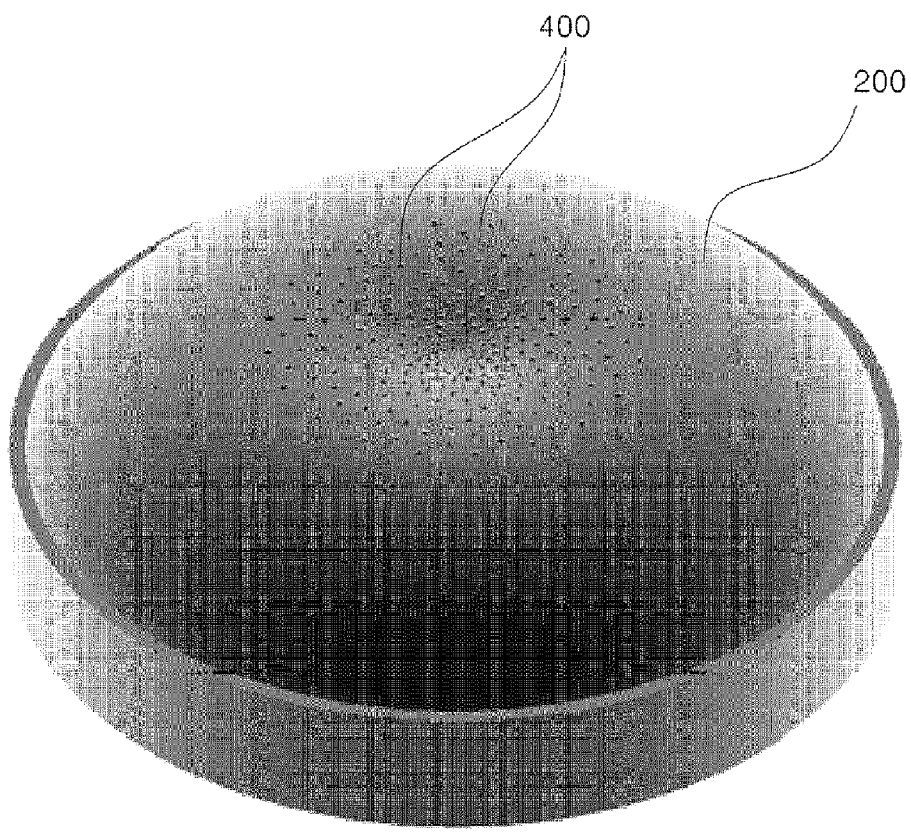
FIG. 10 is a perspective view showing an optical lens according to a second embodiment of the present invention.
Figure 11:
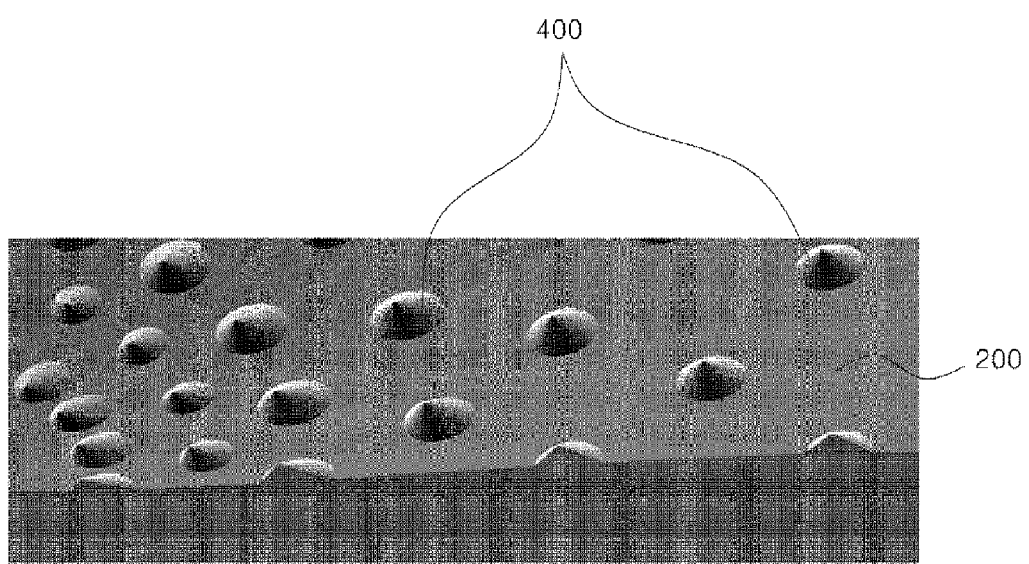
FIG. 11 is an enlarged sectional view showing the main parts of the optical lens according to the second embodiment of the present invention.

Further, as shown in FIGS. 10 and 11, each refraction prevention portion 400 desirably has a conical shape.

A detailed explanation on the refraction prevention portions 400 will be given with reference to the second embodiment of the present invention.

According to the second embodiment of the present invention, a plurality of refraction prevention portions 400 is formed to the conical shape toward the direction of the outer periphery surface of an emitting surface 200 from the center of the emitting surface 200.

That is, the surface of each refraction prevention portion 400 having the conical shape is formed of the group of generating lines formed from the angular point toward the emitting surface 200, and accordingly, any one generating line on the surface of the conical shape forms the point orthogonal to the advancing direction of the light incident through an incident surface 100, so that any one among a number of light emitted through each refraction prevention portion 400 can travel straight, without having any refraction.

On the other hand, as mentioned above, the maximum formation range of the refraction prevention portions 400 is desirably set in the range of about 20% with respect to the emitting surface area between the angle a corresponding to the half of the light emitted from a light emitting diode 500 to the incident surface 100 and the incident angle b where the light is refracted on the interior of the optical lens.

Figure 12:
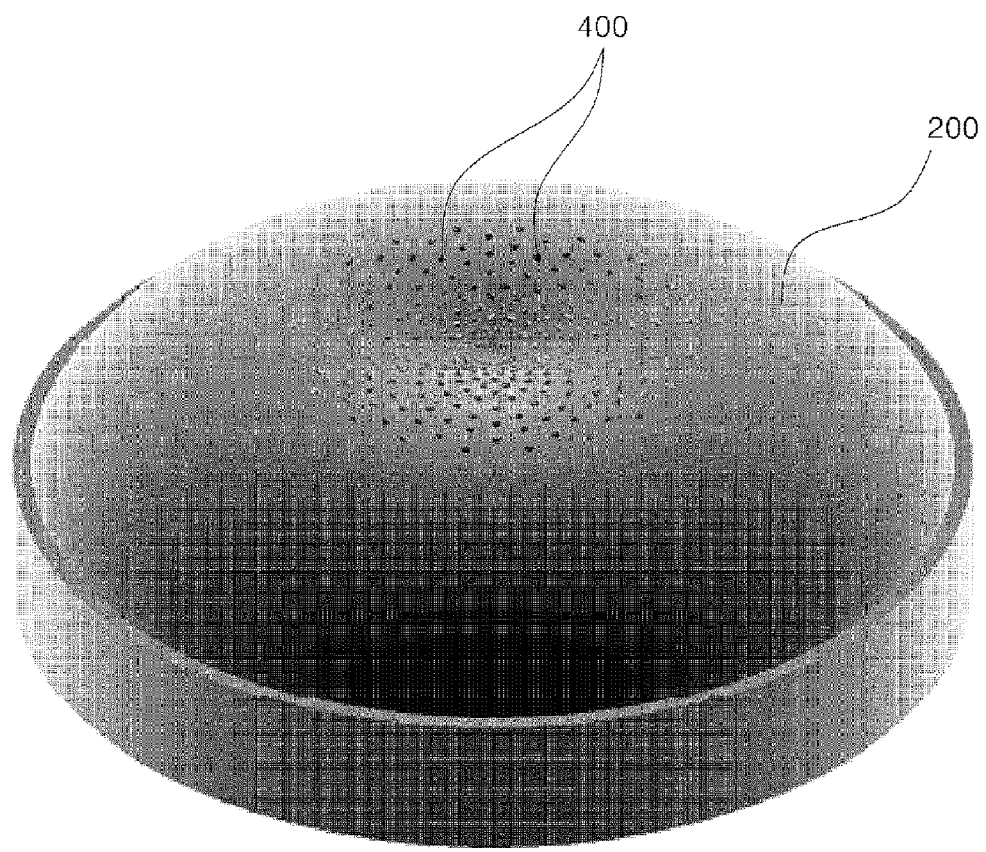
FIG. 12 is a perspective view showing an optical lens according to a third embodiment of the present invention.
Figure 13:
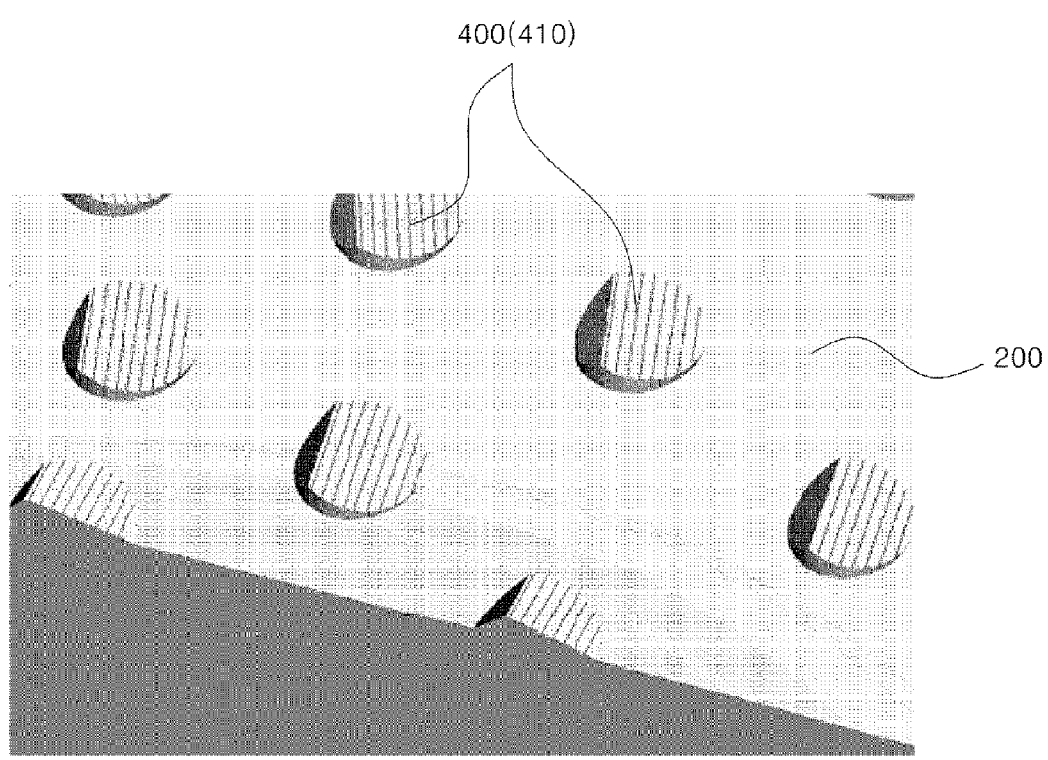
FIG. 13 is an enlarged sectional view showing the main parts of the optical lens according to the third embodiment of the present invention.

Further, as shown in FIGS. 12 and 13, each refraction prevention portion 400 desirably has a shape of a dot protruded from the emitting surface 200, and each dot has a longitudinal sectional shape of a triangle.

A detailed explanation on the refraction prevention portions 400 will be given with reference to the third embodiment of the present invention.

According to the third embodiment of the present invention, a plurality of refraction prevention portions 400 is formed toward the direction of the outer periphery surface of an emitting surface 200 from the center of the emitting surface 200, and as mentioned above, and the maximum formation range of the refraction prevention portions 400 is desirably set in the range of about 20% with respect to the emitting surface area between the angle a corresponding to the half of the light emitted from the light emitting diode 500 to the incident surface 100 and the incident angle b where the light is refracted on the interior of the optical lens.

At this time, the surface of each refraction prevention portion 400 has an orthogonal surface 410 to the advancing direction of light, and therefore, the light passed through the orthogonal surface 410 of each refraction prevention portion 400 travels straight, without having any refraction.

Now, an explanation on the diffusion of the light of the light emitting device on which the optical lens having the refraction prevention portions 400 is mounted will be given.

The light emitting diode 500 is disposed under the optical lens and emits light toward the incident surface 100.

At this time, the light is refracted and incident through the incident surface 100 on the interior of the optical lens.

After that, the light is emitted through the emitting surface 200 toward the outside of the optical lens, and as shown in FIG. 14, the light emitted through the emitting surface 200 on which the refraction prevention portions 400 are not formed is refracted and diffused, whereas the light emitted through the emitting surface 200 on which the refraction prevention portions 400 are formed is emitted straightly, without having any refraction.

That is, the light transmitted through the orthogonal surfaces 410 of the refraction prevention portions 400 with respect to the advancing direction of light is emitted straightly upwardly, without having any refraction, thereby minimizing the reduction of the light intensity around the light axis L.

As described above, the optical lens according to the preferred embodiments of the present invention is characterized in that the refraction prevention portions 400 are artificially formed unitarily on the emitting surface 200.

That is, in the process where the light emitted from the light emitting diode 500 is diffused, the refraction prevention portions 400 having the orthogonal surfaces 410 with respect to the light incident through the incident surface 100 are formed around the light axis L of the optical lens where light intensity is reduced, so that the light transmitted through the refraction prevention portions 400 is emitted straightly upwardly, without having any refraction.

Accordingly, the reduction of the light intensity around the light axis L of the optical lens can be prevented, the luminance distribution of the irradiated member can be uniformly obtained, and the brightness of the light can be improved.

As set forth in the foregoing, the optical lens according to the preferred embodiments of the present invention has the following advantages:

Firstly, the luminance of the light emitted to the irradiated member through the emitting surface can be uniformly distributed. That is, the light emitted through the emitting surface from the interior of the optical lens travels straight, without having any refraction, by means of the plurality of refraction prevention portions formed on the emitting surface, so that the light can be emitted to the center on the surface of the irradiated member to minimize the reduction of the light intensity on the center on the surface of the member.

Secondly, the reduction of the light intensity on the center of the member caused by the diffusion of light to a wide angle according to the characteristics of the optical lens can be avoided, so that the luminance distribution on the surface of the irradiated member can be uniformly obtained and the brightness of the light can be more improved.

Lastly, the brightness of back lighting can be improved, with no diffusion plate like a prism sheet adapted to uniformly distribute the luminance of the light emitted from the light emitting diode, thereby reducing manufacturing cost and thus providing economical advantages.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An optical lens, comprising:
    an incident surface on which light emitted from a light emitting diode is incident and having a concave portion into which the light is received; and
    an emitting surface emitting the light incident on the incident surface 100 therethrough,
    the emitting surface comprising:
    a recessed portion concave against a direction of the emitted light and disposed at a center of the optical lens;
    a light refraction portion configured to refract the light emitted there-through; and
    a plurality of refraction prevention portions disposed on the recessed portion, protruded unitarily from the light refraction portion, and configured to prevent a refraction of the light around a light axis emitted there-through, such that the emitted light travels straight through the plurality of refraction prevention portions without refraction,
    wherein each of the plurality of refraction prevention portions has an orthogonal surface formed thereon to an advancing direction of the light incident through the incident surface, so that the light emitted through the orthogonal surface of each refraction prevention portion travels straight in the direction of the incidence through the incident surface, without having any refraction.

2. The optical lens according to claim 1, wherein a maximum formation range of the refraction prevention portions on the emitting surface is set in a range of about 20% with respect to the emitting surface between an angle 'a' corresponding to a half of the light emitted from the light emitting diode toward the incident surface and an incident angle 'b' where the light is refracted on an interior of the optical lens.

3. The optical lens according to claim 1, wherein each refraction prevention portion is formed in a circumference in a concentric direction from the center of the emitting surface.

4. The optical lens according to claim 1, wherein each refraction prevention portion has a shape of a dot protruded from the emitting surface around the light axis, and a longitudinal cross section of each dot has a shape of a triangle, and each dot has an orthogonal surface to an advancing direction of the light incident through the incident surface.

5. An optical lens, comprising:
    an incident surface on which light emitted from a light emitting diode is incident and having a concave portion into which the light is received; and
    an emitting surface emitting the light incident on the incident surface therethrough,
    a recessed portion concave against a direction of the emitted light and disposed at a center of the optical lens;
    a light refraction portion configured to refract the light emitted there-through; and
    a plurality of refraction prevention portions disposed on the recessed portion, protruded unitarily from the light refraction portion, and configured to prevent a refraction of the light around a light axis emitted there-through, such that the emitted light travels straight through the plurality of refraction prevention portions without refraction,
    wherein each refraction prevention portion has a shape of a cone having a generating line orthogonal to an advancing direction of the light incident through the incident surface.

* * * * *